United States Patent
Yamauchi (10) Patent No.: US 7,276,761 B2
(45) Date of Patent: Oct. 2, 2007

(54) SEMICONDUCTOR MEMORY DEVICE HAVING INSULATING FILM OF VARYING THICKNESS OVER BIT LINES

(75) Inventor: Yoshimitsu Yamauchi, Nabari (JP)

(73) Assignee: Sharp Kabushiki Kaisha, Osaka (JP)

( * ) Notice: Subject to any disclaimer, the term of this patent is extended or adjusted under 35 U.S.C. 154(b) by 281 days.

(21) Appl. No.: 11/086,565

(22) Filed: Mar. 23, 2005

(65) Prior Publication Data

US 2005/0212023 A1   Sep. 29, 2005

(30) Foreign Application Priority Data

Mar. 25, 2004   (JP)   ............... 2004-089617

(51) Int. Cl.
  *H01L 29/792*   (2006.01)
(52) U.S. Cl. ...................... 257/324; 257/326
(58) Field of Classification Search ......... 257/314–326
  See application file for complete search history.

(56) References Cited

U.S. PATENT DOCUMENTS 7,105,888 B2 *   9/2006   Yoshino ...................... 257/324

FOREIGN PATENT DOCUMENTS

| JP | 05-326893 | 12/1993 |
|----|-----------|---------|
| JP | 2001-77220 | 3/2001 |
| JP | 2001-284557 | 10/2001 |
| JP | 2003-163289 | 6/2003 |
| JP | 2003-282748 | 10/2003 |
| WO | WO 03/107416 | 12/2003 |

\* cited by examiner

*Primary Examiner*—Cuong Nguyen
(74) *Attorney, Agent, or Firm*—Nixon & Vanderhye P.C.

(57) ABSTRACT

A semiconductor memory device of the invention comprises a plurality of bit lines formed by implanting a second conductive-type impurity in a first conductive-type semiconductor substrate; a thick insulating film on the bit lines; a thin insulating film between the neighboring bit lines; and a plurality of word lines formed on the thick and thin insulating films so as to cross the bit lines, wherein each of the word lines includes a plurality of first conductors and a second conductor which electrically connects the first conductors in series, the respective first conductors are formed on the thin insulating film, the top face of the thickest portion of the thick insulating film is higher than the top face of the first conductors, and the film thickness of the thick insulating film is made thinner toward the end.

8 Claims, 6 Drawing Sheets

SEMICONDUCTOR MEMORY DEVICE HAVING INSULATING FILM OF VARYING THICKNESS OVER BIT LINES

CROSS-REFERENCE TO RELATED APPLICATION

This application is related to Japanese application No. 2004-089617 filed on Mar. 25, 2004 whose priority is claimed under 35 USC § 119, the disclosure of which is incorporated by reference in its entirety.

BACKGROUND OF THE INVENTION

1. Field of the Invention

The invention relates to a semiconductor memory device and, more specifically, to a semiconductor memory device having contactless memory arrays.

2. Description of Related Art

Conventionally, as a fabrication method of a semiconductor memory device having contactless memory arrays, the following method has been known (reference to, for example, Japanese Unexamined Patent Publication No. 2001-77220)

In this method, an ONO layer is formed on a substrate, the ONO layer is etched to form a plurality of columns, an impurity is implanted between the neighboring columns to form bit lines, an oxide is grown thermally on the bit lines, and a plurality of rows made of polysilicon or the like are formed on the ONO layer and the bit line oxide so as to cross the columns of the ONO layer.

However, according to the conventional method, it is necessary to carry out a step of thermally growing the oxides on the bit lines after the bit line formation. In the step, therefore, the impurity for forming the bit lines is diffused to make shortening the channel of a transistor difficult.

Further, it is also difficult to form the oxide in a thick layer on the bit lines; thus, it is difficult to suppress a parasitic capacitance between the bit lines and the word lines to be low.

SUMMARY OF THE INVENTION

In view of the above-mentioned state of the art, the invention has been accomplished and aims to provide a semiconductor memory device in which a channel of a transistor can be shortened and a parasitic capacitance between bit lines and word line can be suppressed to be low.

A semiconductor memory device of the invention comprises a plurality of bit lines formed by implanting a second conductive-type impurity in a first conductive-type semiconductor substrate; a thick insulating film on the bit lines; a thin insulating film between the neighboring bit lines; and a plurality of word lines formed on the thick and thin insulating films so as to cross the bit lines, wherein each of the word lines includes a plurality of first conductors and a second conductor which electrically connects the first conductors in series, the respective first conductors are formed on the thin insulating film, the top face of the thickest portion of the thick insulating film is higher than the top face of the first conductors, and the film thickness of the thick insulating film is made thinner toward the end.

A semiconductor memory device fabrication method of the invention comprises the steps of: (1) forming a plurality of columns of a thin insulating film on a first conductive-type semiconductor substrate, first conductors thereon, and first and second insulating films further thereon in this order; (2) forming bit lines by implanting a second conductive-type impurity in the semiconductor substrate using the second insulating film as a mask; (3) forming a third insulating film having slanting corners between the neighboring columns by forming the third insulating film between the neighboring columns in a such manner that the top face of the third insulating film is made higher than the top face of the second insulating film, removing the second insulating film selectively, and etching the entire first insulating film and a part of the third insulating film in such a manner that the first conductors are exposed; (4) forming a plurality of rows of second conductors so as to electrically connect the first conductors in series; and (5) forming word lines by patterning the first conductors using the second conductors as a mask.

According to the semiconductor memory device of the invention, an insulating film with a large thickness can be provided among a plurality of bit lines, and a parasitic capacitance between bit lines and word lines can be lowered.

In addition, according to the semiconductor memory device fabrication method of the invention, unlike a conventional technique, it is unnecessary to carry out a high temperature step after forming bit lines by implanting a second conductive-type impurity in a semiconductor substrate, so that the impurity for forming the bit lines is prevented from diffusion and, thus, a transistor with a short channel can be fabricated.

BRIEF DESCRIPTION OF THE DRAWINGS

FIG. 1A-FIG. 1C show a semiconductor memory device wherein

FIG. 2A and FIG. 2B show a fabrication process of a semiconductor memory device according to Example 1 wherein

FIG. 3A and FIG. 3B show a fabrication process of a semiconductor memory device according to Example 1 wherein

FIG. 4A and FIG. 4B show a fabrication process of a semiconductor memory device according to Example 1 wherein

FIG. 5A and FIG. 5B show a semiconductor memory device according to Example 2 wherein

FIG. 6A and FIG. 6B show a semiconductor memory device according to Example 3 wherein

FIG. 7A and FIG. 7B show a semiconductor memory device according to Example 4 wherein

DESCRIPTION OF THE PREFERRED EMBODIMENTS

First Embodiment

A semiconductor memory device of the invention includes a plurality of bit lines formed by implanting a second conductive-type impurity in a first conductive-type semiconductor substrate, a plurality of word lines formed on the semiconductor substrate so as to cross the bit lines, and a multilayer insulating film provided under the word lines between the neighboring bit lines. Each of the word lines includes a plurality of first conductors and a second conductor which electrically connects the first conductors in series, and the respective first conductors are formed on the multilayer insulating film.

Herein, the phrase "on the semiconductor substrate" includes the state of being in contact with the semiconductor substrate, and adjacent to the semiconductor substrate through a protective film, an insulating film or the like. Other phrases such as "on the film" and "on the layer" also imply similarly as described.

A substrate made of a semiconductor such as single crystal or polycrystalline silicon may be used as the semiconductor substrate. A single-crystal silicon substrate is preferably used.

The first conductive-type means a p-type or an n-type, and the second conductive-type means a conductive-type different from the first conductive-type.

For an impurity, sources containing B or Al may be used for a p-type impurity, and sources containing P or As may be used for an n-type impurity.

"Implantation" means introducing an impurity into a semiconductor substrate to form an impurity layer, and includes an ion injection method and a method involving applying a source containing an impurity to a semiconductor substrate and successive heating. In the case the multilayer insulating film is formed in form of an ONO layer, it becomes a charge holding layer if electric charges are held therein. However, In the case of using the device as a mask ROM (not as a nonvolatile semiconductor memory device), electric charges are not required to be held therein.

A plurality of bit lines are preferably formed to have a predetermined width and in parallel to one another. The bit lines are also preferable to be formed by ion injection of an impurity using the first conductors as a mask.

The respective bit lines may be provided with an insulating film thereon and the film thickness of the insulating film may be made thicker than the multilayer insulating film. The parasitic capacitance between the bit lines and the word lines can be suppressed to be low by making the film thickness of the insulating film on the bit lines thicker.

Further, the respective bit lines may be provided with an insulating film thereon, the top face of the thickest portion of the insulating film on the respective bit lines may be made higher than the top face of the first conductors, and the film thickness of the thick insulating film is made thinner toward the end, for example, by thinning at the corner portions. In this case, the insulating film can be made thicker and the parasitic capacitance between the bit lines and the word lines can further be lowered.

The dielectric constant of the insulating film is preferable to be smaller than that of the multilayer insulating film, which will be described later. For example, in the case the multilayer insulating film is formed in form of an ONO layer, the insulating film may be formed using a fluorine-containing material such as SiOF having a low dielectric constant. Formation of the insulating film using a material with a low dielectric constant contributes to further decrease of the parasitic capacitance between the bit lines and the word lines, and makes high speed operation of the semiconductor memory device possible.

The semiconductor memory device is provided with an impurity region having the same conductive-type as and a different concentration from that of the semiconductor substrate between neighboring bit lines. Formation of the impurity region makes adjustment of a threshold voltage or the like of the semiconductor memory device possible.

Each of the word lines includes first and second conductors. The first and second conductors can be formed using a metal such as Al or Cu, an alloy containing such a metal, polycrystalline silicon, a silicide such as tungsten silicide, or a combination thereof. The first and second conductors may be formed using the same material or different materials.

The word lines are preferably formed in parallel to one another, and are preferably orthogonal to the bit lines.

Element isolation regions may be formed between the neighboring word lines. The element isolation regions can be formed by forming high concentration impurity regions by implanting an impurity with the same conductive-type as that of the semiconductor substrate between the neighboring word lines. Further, the element isolation regions may be formed as self-alignment trench isolation regions by forming trenches between the neighboring word lines and filling the trenches with an insulator.

The multilayer insulating film may be replaced with a single layer insulating film and is exemplified by a charge holding layer.

The multilayer insulating film may be in form of an ONO layer and may have a structure that a floating gate is sandwiched by insulating films from the upper and lower sides. The phrase "under the word lines" includes the state of being in contact with the word lines, adjacent to the word lines through the protective film, insulating film or the like, or in non-contact with and under the word lines.

Those including other films and layers such as insulating films and protective films additionally inserted into the above-mentioned respective films and layers are also included within the scope of the inventive context as defined in the attached claims.

Second Embodiment

A semiconductor memory device fabrication method of the invention involves the steps of: (1) forming a plurality of columns of a multilayer insulating film on a first conductive-type semiconductor substrate and first conductors thereon in this order, (2) forming bit lines by implanting a second conductive-type impurity in the semiconductor substrate using the first conductors as a mask, (3) forming an insulating film between the neighboring columns, (4) forming a plurality of rows of second conductors so as to electrically connect the first conductors in series, and (5) forming word lines by patterning the first conductors using the second conductors as a mask.

In this embodiment, the explanations using the same terms as those of the first embodiment are similarly applied in this embodiment; therefore, such explanations are omitted.

At first, a multilayer insulating film is formed on the semiconductor substrate by a CVD method or a vacuum evaporation method, and the first conductors are formed thereon. The first conductors are preferably formed in a thin film state.

Next, portions of the multilayer insulating film and the first conductors other than the portions to be the columns are etched and removed by a photolithography and etching technique to form a plurality of columns of the multilayer insulating film and the first conductors thereon.

Additionally, before the formation of the multilayer insulating film, a step of forming impurity regions with different in concentration or conductive-type from the semiconductor substrate in portions where the columns are to be formed may be added. This step may be carried out by forming a mask covering portions other than the portions where the columns are to be formed and implanting impurity ion.

Next, the second conductive-type impurity is implanted in the semiconductor substrate using the first conductors as a mask. Impurity ion implantation may be carried out by impurity ion injection or by applying a source containing the impurity and carrying out heating treatment thereafter. The impurity regions formed by impurity implantation become bit lines.

Next, an insulating film is formed between the neighboring columns. The insulating film can be formed by a CVD method and is preferably formed in a thickness sufficient to cover the first conductors. In this case, the insulating film is ground thereafter by a CMP method or the like until the surface of the first conductors are exposed.

Further, the insulating film between the neighboring columns may be formed by (a) forming a first insulating film on the first conductors, (b) forming a second insulating film on the first insulating film, (c) forming a third insulating film between the neighboring columns in such a manner that the top face of the third insulating film is made higher than the top face of the first insulating film, (d) removing the second insulating film selectively, and (e) etching the first and third insulating films until the first conductors are exposed. According to this method, the top face in the thickest portion of the insulating film is higher than the top face of the first conductors, and the film thickness of the insulating film is thinner toward the end. Also, according to the method, without changing the thickness of the first conductors, the thickness of the insulating film can be made thick; thus, the parasitic capacitance between the bit lines and the word lines can be suppressed to be low. Also, since the film thickness of the insulating film is thinner toward the end, the step between the insulating film and the first conductors are narrowed to make the patterning of the first conductors thereafter easy.

Next, a plurality of rows of second conductors are formed so as to electrically connect the first conductors in series by a photolithography and etching technique.

Next, patterning of the first conductors and the multilayer insulating film is carried out using the second conductors as a mask. Thus, word lines each including the first and second conductors are formed.

The fabrication method may further involve a step of patterning the multilayer insulating film using the second conductors as a mask.

Next, the fabrication method may involve a step of implanting an impurity with the same conductive-type as that of the semiconductor substrate into regions between the neighboring second conductors. Accordingly, element isolation regions, which are high concentration impurity regions, can be formed between the word lines. The fabrication method may involve a step of forming trenches between the word lines in the semiconductor substrate and filling the trenches with an insulator. In this case also, element isolation regions can be formed between the word lines.

According to this embodiment, the gate length of the cell Tr is determined to be the width of the column of the first conductors in the step (2) in self-alignment manner and the gate width is determined to be the width of the row of the second conductors in the step (6) in self-alignment manner.

EXAMPLE 1

Hereinafter, examples of the invention will be described in detail on the basis of the embodiments of the invention.

Figure 1A:
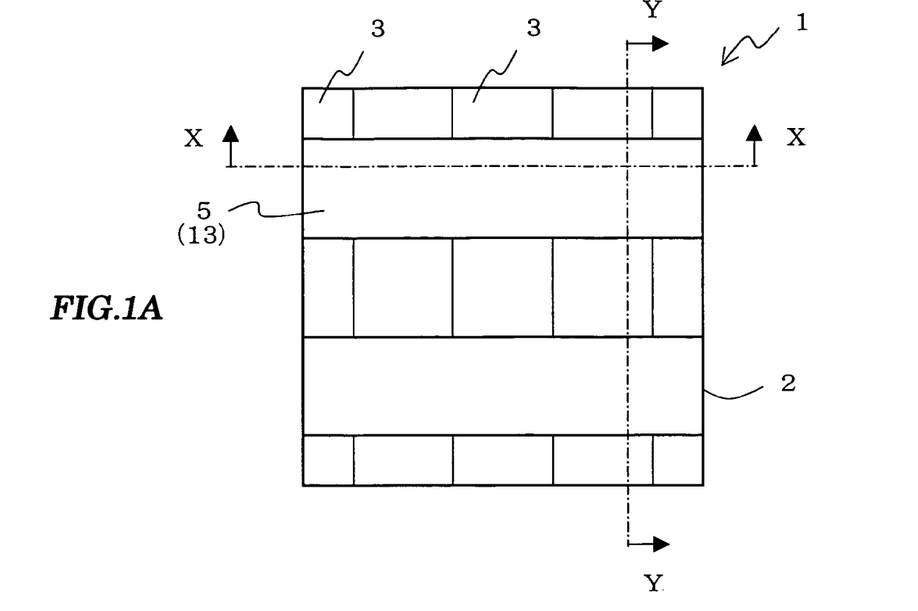
FIG. 1A is a plan view.
Figure 1B:
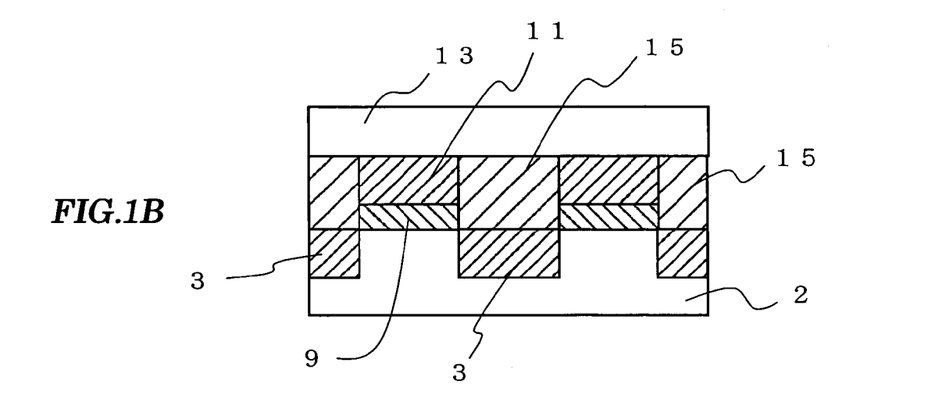
FIG. 1B and 1C are cross-sectional views taken along line X-X and Y-Y of FIG. 1A, respectively.
Figure 1C:
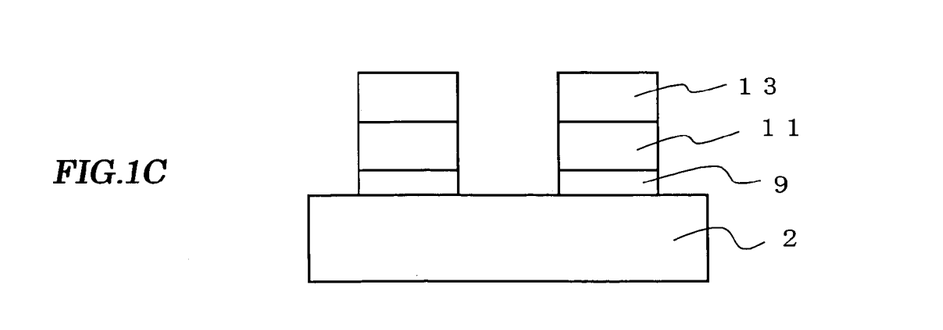

FIG. 1A and FIG. 1B show a semiconductor memory device 1 according to Example 1 wherein FIG. 1A is a plan view, FIGS. 1B and 1C are cross-sectional views taken along line X-X and Y-Y of FIG. 1A, respectively. In this example, a nonvolatile semiconductor memory device can be fabricated The semiconductor memory device 1 of this example includes a plurality of bit lines 3 formed by implanting As ion, a n-type impurity, into a p-type silicon semiconductor substrate 2, and a plurality of word lines 5 formed so as to cross the bit lines 3 on the semiconductor substrate 1. As shown in FIG. 1B, a charge holding layer 9 made of an ONO layer, is formed between the bit lines 3 and under the word lines 5. Each of the word lines 5 includes control gate lower-layer patterns 11 and a control gate upper-layer pattern 13. The control gate lower-layer patterns 11 are formed on the charge holding layer 9. Further, an insulating film 15 made of $SiO_2$ is formed on the bit lines 3.

The control gate lower-layer patterns 11 are made of a polysilicon film, and the control gate upper-layer pattern 13 is made of tungsten and cobalt silicide or the like.

Figure 2A:
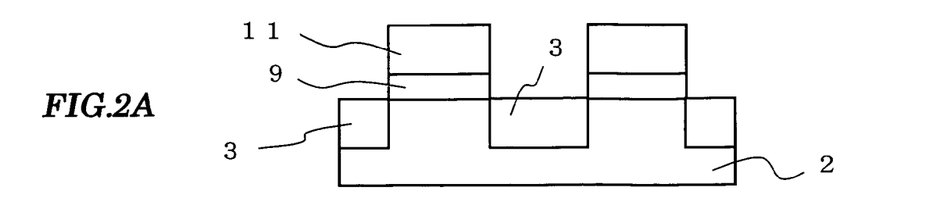
FIG. 2A and 2B are cross-sectional views taken along line X-X and Y-Y of FIG. 1A, respectively.
Figure 2B:
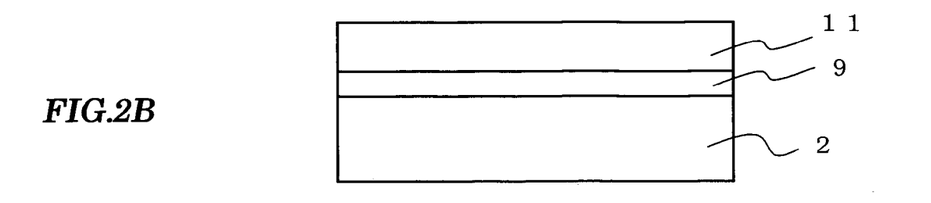
Figure 3A:
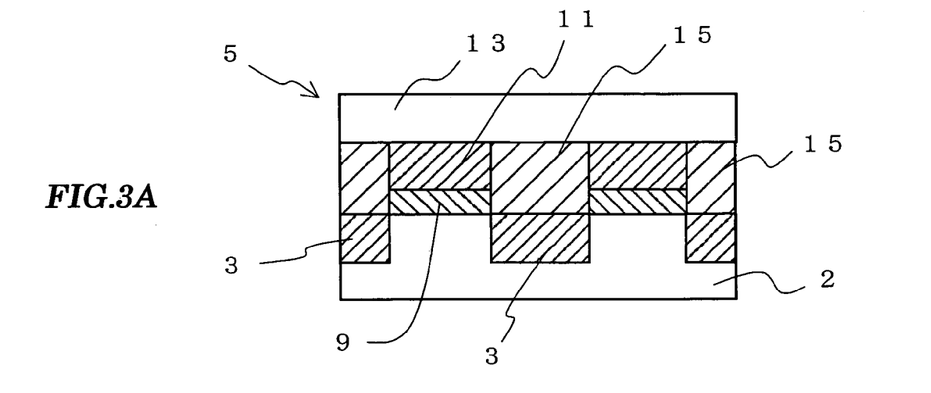
FIG. 3A and 3B are cross-sectional views taken along line X-X and Y-Y of FIG. 1A, respectively.
Figure 3B:
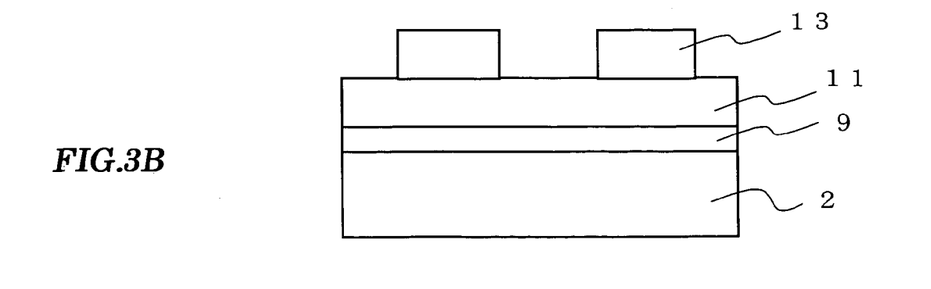
Figure 4A:
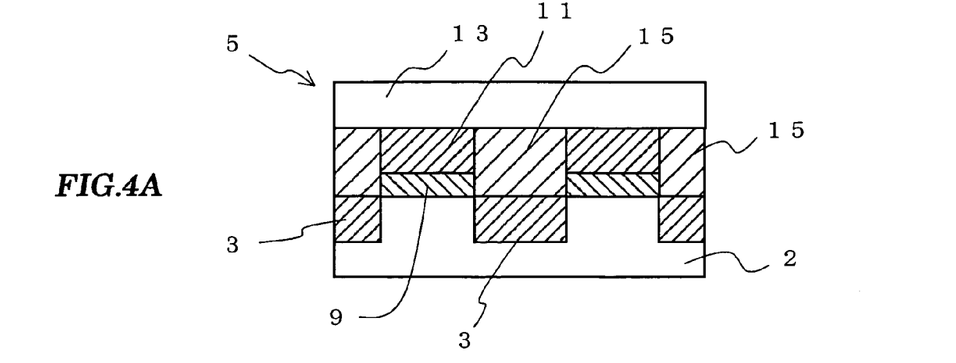
FIG. 4A and 4B are cross-sectional views taken along line X-X and Y-Y of FIG. 1A, respectively.
Figure 4B:
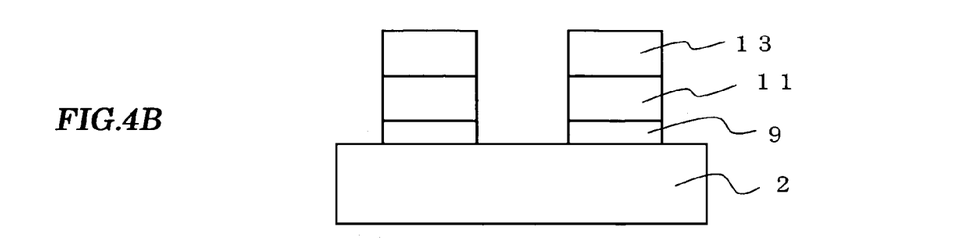

FIGS. 2 to 4 show fabrication steps of the semiconductor memory device 1 of this example. In the respective drawings, "A" and "B" are cross-sectional views taken along line X-X and Y-Y of FIG. 1A, respectively.

At first, an ONO layer (silicon oxide film/silicon nitride film/silicon oxide film) and a polysilicon film are deposited on the semiconductor substrate 2. Next, a charge holding layer 9 made of an ONO layer, and control gate lower-layer patterns 11 made of the polysilicon film are formed by photolithography and etching technique. Next, using the control gate lower-layer patterns 11 as a mask, arsenic ion implantation is carried out to form bit lines 3 made of an n-type impurity diffusion layer and obtain the structure shown in FIG. 2A and FIG. 2B.

Next, after an oxide film 15 is deposited, the surface of the control gate lower-layer patterns 11 are exposed by a CMP technique. Next, tungsten silicide is deposited, and control gate upper-layer patterns 13 made of the tungsten silicide are formed by a photolithography and etching technique to obtain the structure shown in FIG. 3A and FIG. 3B.

Next, using the control gate upper-layer patterns 13 as a mask, the control gate lower-layer patterns 11 and the charge holding layer 9 are etched to obtain the structure shown in FIG. 4A and FIG. 4B and complete the fabrication of the semiconductor memory device of this example.

Hereafter, interlayer insulating film formation, contact hole opening and wiring formation, and protective film formation may further be carried out.

In this example, the gate length is determined on the basis of the control gate lower-layer patterns 11 and the gate channel width is determined on the basis of the control gate upper-layer patterns 13.

EXAMPLE 2

Figure 5A:
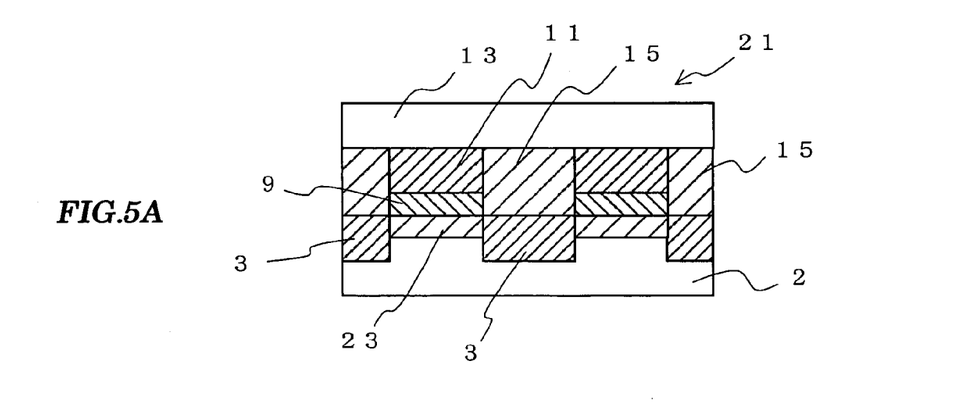
FIG. 5A and 5B are cross-sectional views taken along line X-X and Y-Y of FIG. 1A, respectively.
Figure 5B:
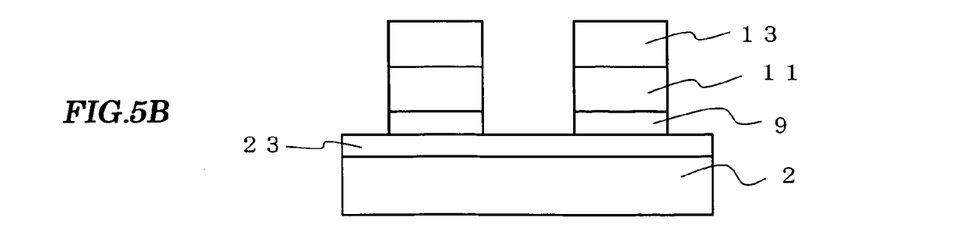

FIG. 5A and FIG. 5B show a semiconductor memory device 21 according to Example 2 of the invention, wherein FIG. 5A and 5B are cross-sectional views taken along line X-X and Y-Y of FIG. 1A, respectively. The semiconductor memory device 21 of this example includes a p-type impurity diffusion layer 23 between neighboring bit lines 3. Other constitutions are the same as those in Example 1.

The semiconductor memory device 21 of this example can be fabricated by, at first, forming a p-type impurity diffusion layer 23 by implanting boron in predetermined regions of a semiconductor substrate 2 and, then, carrying out the same steps as those of Example 1.

In this example, the concentration of the p-type impurity diffusion layer 23 is adjusted, so that the threshold voltage of the semiconductor memory device 21 can be adjusted. In this case, the semiconductor memory device 21 functions as a mask ROM. Therefore, in this example, a multilayer insulating film holding no electric charges is formed instead of a charge holding layer.

EXAMPLE 3

Figure 6A:
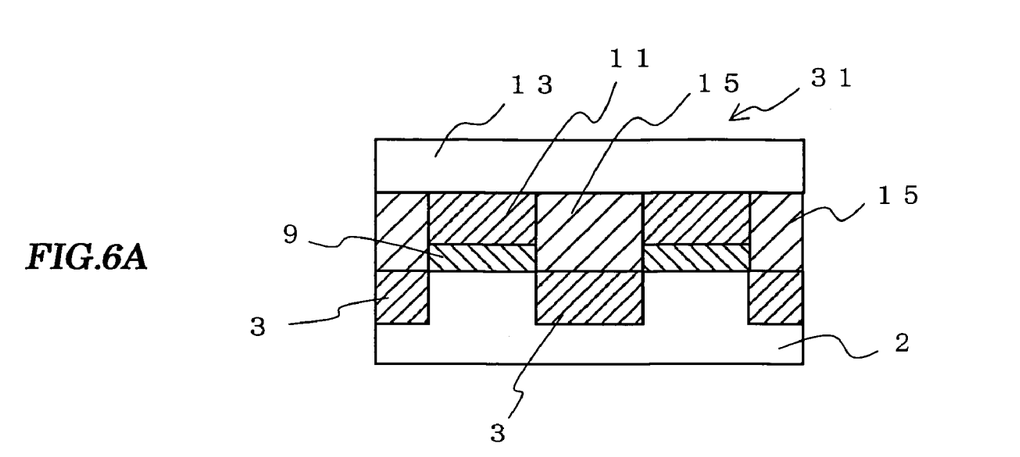
FIG. 6A and 6B are cross-sectional views taken along line X-X and Y-Y of FIG. 1A, respectively.
Figure 6B:
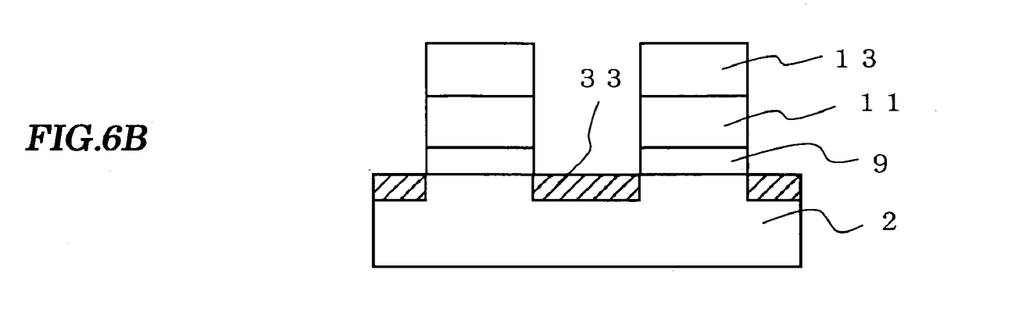

FIG. 6A and FIG. 6B show a semiconductor memory device 31 according to Example 3 wherein FIG. 6A and 6B are cross-sectional views taken along line X-X and Y-Y of FIG. 1A, respectively. The semiconductor memory device 31 of this example includes impurity regions 33 having p-type high impurity concentration which is the same conductive type as that of a semiconductor substrate 2 between control gate upper-layer patterns 13. Other constitutions are the same as those in Example 1.

The semiconductor memory device 31 of this example can be fabricated by implanting boron between the control gate upper-layer patterns 13 using the control gate upper-layer patterns 13 as a mask after completion of the fabrication of the semiconductor device of Example 1 in accordance with the steps of Example 1.

The formed high-concentration impurity regions 33 become element isolation regions.

EXAMPLE 4

Figure 7A:
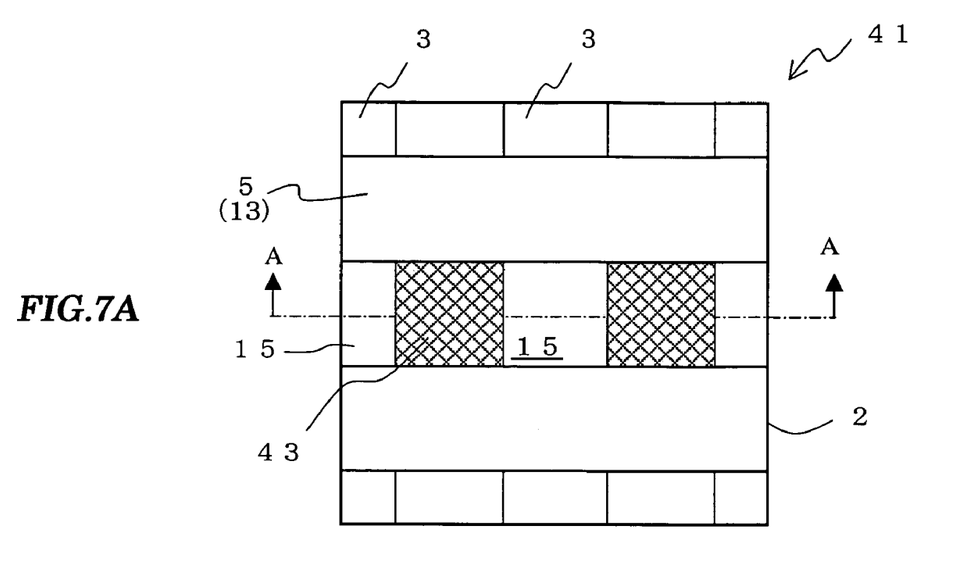
FIG. 7A is a plan view.
Figure 7B:
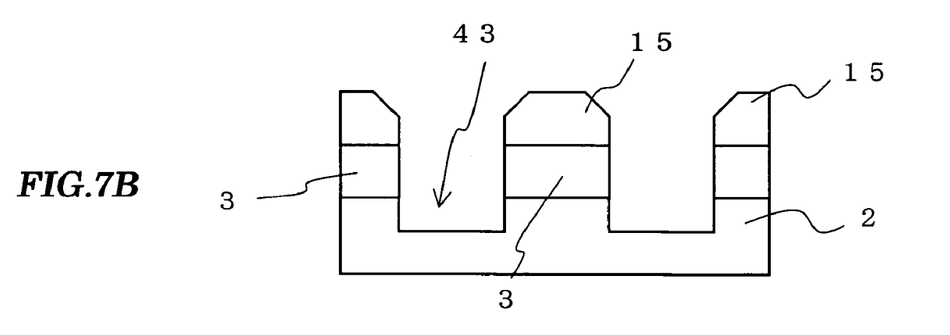
FIG. 7B is a cross-sectional view taken along line A-A of FIG. 7A, respectively.

FIG. 7A and FIG. 7B show a semiconductor memory device 41 according to Example 4 wherein FIG. 7A is a plan view showing element isolation regions (trench isolation regions) 43, and FIG. 7B is a cross-sectional view taken along line A-A of FIG. 7A. The trench isolation regions 43 are formed in self-alignment manner using a control gate 13 and an insulating film 15 as a mask.

In this example, the semiconductor memory device 41 includes trenches 43 between neighboring control gate upper-layer patterns 13, and the trenches 43 are filled with an insulating film made of silicon oxide. Other constitutions are the same as those in Example 1.

The semiconductor memory device 41 of this example is fabricated by forming the trenches 43 by etching the semiconductor substrate 2 between the neighboring control gate upper-layer patterns 13 and forming the insulating film so as to fill the trenches 43 by a CVD method after completion of the fabrication of the semiconductor device of Example 1 in accordance with the steps of Example 1.

Accordingly, element isolation regions are formed.

EXAMPLE 5

FIG. 8A-FIG. 8D show a fabrication process of a semiconductor memory device according to Example 5. At first, a charge holding layer 9 made of an ONO layer, control gate lower-layer patterns 11 made of a polysilicon film, a first insulating film 51, and a second insulating film 52 are formed in this order on a semiconductor substrate 2. Next, using the second insulating film 52 as a mask, arsenic ion implantation is carried out to form bit lines 3 of an n-type impurity diffusion layer and obtain the structure shown in FIG. 8A.

Next, a third insulating film 15 is formed between the neighboring columns by controlling the deposition conditions so as to make the top face of the third insulating film 15 existing between the neighboring columns higher than the top face of the second insulating film 52 so that the third insulating film 15 covers the second insulating film 52. Next, the third insulating film 15 is retreated by CMP to expose the second insulating film 52 and obtain the structure shown in FIG. 8B. The method for retreating may properly be selected depending on the materials and qualities of the second insulating film 52 and the third insulating film 15. For example, wet etching using hydrofluoric acid, hot phosphoric acid, nitric acid or the like, dry etching in combination with an RIE method, and a CMP method can be exemplified. In the case a silicon nitride film is used as the second insulating film 52 and a silicon oxide film formed by HDP-CVD is used as the third insulating film 15, the third insulating film 15 is preferably retreated by a CMP method.

Figure 8A:
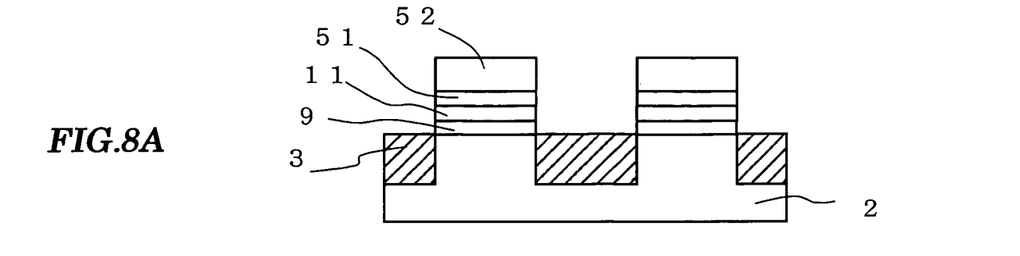
FIG. 8A-FIG. 8D show a fabrication process of a semiconductor device according to Example 5.
Figure 8B:
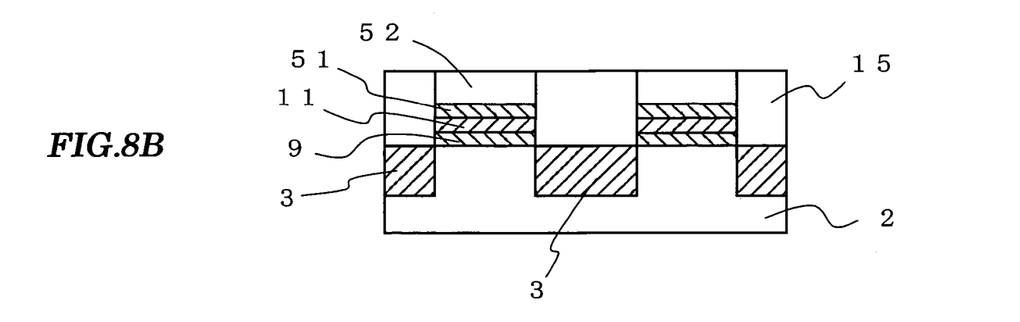
Figure 8C:
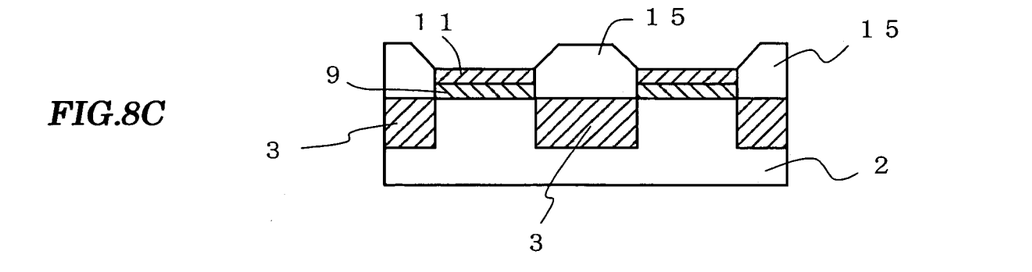

Next, after selective removal of the second insulating film 52, while the third insulating film 15 is being retreated, the first insulating film 51 is removed to obtain the structure shown in FIG. 8C. The first insulating film 51 is completely removed, whereas the third insulating film 15 is removed incompletely and made thinner toward the end.

At that time, if a hydrofluoric acid type etchant is used, a structure of the third insulating film whose corners are slanted can be formed.

Figure 8D:
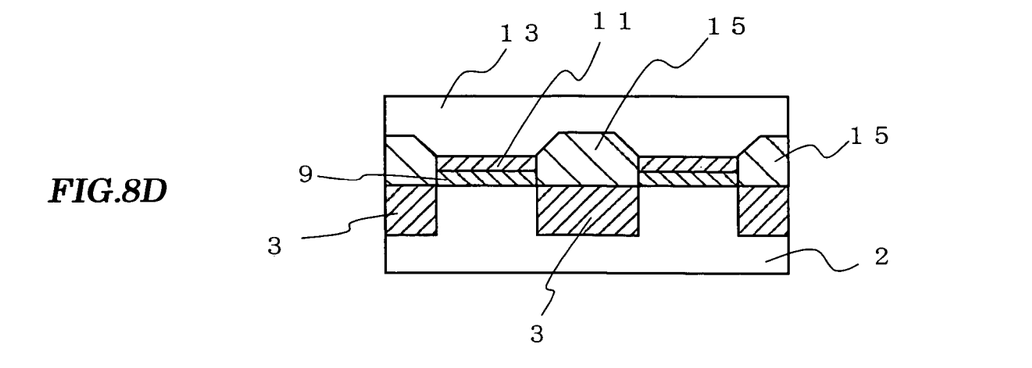

Next, tungsten silicide is deposited and control gate upper-layer patterns 13 made of the tungsten silicide is formed by a photolithography and etching technique to obtain the structure shown in FIG. 8D.

After that, using the control gate upper-layer patterns 13 and the third insulating film 15 as a mask, patterning of the control gate lower-layer patterns 11 is carried out. Since the thickness of the third insulating film 15 is made thinner toward the end, the step between the third insulating film 15 and the control gate lower-layer patterns 11 can be narrow. Also, since the upper side of the control gate lower-layer patterns 11 is widely opened, the patterning of the control gate lower-layer patterns 11 is made easy.

What is claimed is:
1. A semiconductor memory device comprising:
   a plurality of bit lines formed by implanting a second conductive-type impurity in a first conductive-type semiconductor substrate;
   a thick insulating film on the bit lines;
   a thin insulating film between the neighboring bit lines; and
   a plurality of word lines formed on the thick and thin insulating films so as to cross the bit lines, wherein each of the word lines includes a plurality of first conductors and a second conductor which electrically connects the first conductors in series, the respective first conductors are formed on the thin insulating film, wherein the thick insulating film comprises first and second opposing and substantially vertically oriented sidewalls and a top face which interconnects the sidewalls, wherein the top face of the thickest portion of the thick insulating film is higher than the top face of the first conductors, and the uppermost portions of the respective substantially vertically oriented sidewalls of the thick insulating film are located at an elevation above a top surface of the thin insulating film; and the film thickness of the thick insulating film is made thinner toward edges of the top face where the top face angles downwardly and meets the substantially vertically oriented sidewalls.

2. The device of claim 1, wherein the thin insulating film is a multilayer insulating film.

3. The device of claim 2, wherein the multilayer insulating film is an ONO film.

4. The device of claim 1, wherein the thick insulating film has a lower dielectric constant than that of the thin insulating film.

5. The device of claim 1, further comprising an impurity regions located between adjacent bit lines, having the same conductive-type as and a different concentration from that of the semiconductor substrate, or having a different conductive-type from that of the semiconductor substrate.

6. The device of claim 1, further comprising element isolation regions between the neighboring word lines.

7. The device of claim 6, wherein the element isolation regions are first conductive-type impurity regions with higher concentration.

8. The device of claim 6, wherein the element isolation regions are self-aligning trench isolation regions.

* * * * *